US012573776B2

(12) United States Patent
Takamura et al.

(10) Patent No.: US 12,573,776 B2
(45) Date of Patent: Mar. 10, 2026

(54) CONNECTOR, BOARD ASSEMBLY

(71) Applicant: Yazaki Corporation, Tokyo (JP)

(72) Inventors: Naoki Takamura, Makinohara (JP);
Daigo Yokoyama, Makinohara (JP);
Yuta Tezuka, Makinohara (JP); **Yuya
Kishibata**, Makinohara (JP)

(73) Assignee: YAZAKI CORPORATION, Tokyo
(JP)

( * ) Notice: Subject to any disclaimer, the term of this
patent is extended or adjusted under 35
U.S.C. 154(b) by 336 days.

(21) Appl. No.: 18/540,444

(22) Filed: Dec. 14, 2023

(65) Prior Publication Data
US 2024/0243500 A1     Jul. 18, 2024

(30) Foreign Application Priority Data
Jan. 17, 2023     (JP) ................................. 2023-005312

(51) Int. Cl.
*H01R 12/71*          (2011.01)
*H01R 13/428*       (2006.01)
*H05K 1/11*          (2006.01)

(52) U.S. Cl.
CPC ......... *H01R 12/716* (2013.01); *H01R 13/428*
(2013.01); *H05K 1/111* (2013.01); ***H05K
2201/10189*** (2013.01)

(58) Field of Classification Search
CPC .... H01R 12/716; H01R 13/428; H01R 43/18;
H01R 12/724; H01R 13/405; H05K
1/111; H05K 2201/10189; B29C 45/0025;
B29C 45/0046; B29C 2045/0027
See application file for complete search history.

(56) References Cited

U.S. PATENT DOCUMENTS

| | | | |
|---|---|---|---|
| 2012/0064737 A1* | 3/2012 | Sass ..................... | H01R 12/721 |
| | | | 439/65 |
| 2015/0155435 A1* | 6/2015 | Nei ....................... | H10H 20/857 |
| | | | 257/98 |
| 2015/0311620 A1 | 10/2015 | Tateishi et al. | |
| 2020/0136285 A1* | 4/2020 | Kitajima .............. | H01R 12/716 |
| 2021/0098927 A1* | 4/2021 | Si ........................ | H01R 13/6474 |
| 2021/0249804 A1* | 8/2021 | Chin ...................... | H01R 12/79 |

FOREIGN PATENT DOCUMENTS

| | | |
|---|---|---|
| JP | 2000-323858 A | 11/2000 |
| JP | 2004-178425 A | 6/2004 |
| JP | 2009-051028 A | 3/2009 |
| JP | 2014-4761 A | 1/2014 |
| JP | 2022-68976 A | 5/2022 |

* cited by examiner

*Primary Examiner* — Abdullah A Riyami
*Assistant Examiner* — Nelson R. Burgos-Guntin
(74) *Attorney, Agent, or Firm* — Sughrue Mion, PLLC

(57)          ABSTRACT

A connector for mounting to a printed circuit board by
surface mounting includes: a plurality of terminals; and a
housing holding the plurality of terminals. The housing is
made of an insulating synthetic resin including glass fibers.
The housing has a box shape with a bottom wall, an upper
wall, a pair of lateral walls, a rear wall, and an opening in
a front side of the housing. A plurality of first thinned
recesses is provided in an outer surface of the bottom wall,
and a plurality of second thinned recesses is provided in an
outer surface of the upper wall. The first thinned recesses
extend along a front-rear direction of the housing so that rear
ends of the first thinned recesses reach the rear wall and front
ends of the first thinned recesses do not reach the front side,
and the front ends are tapered.

6 Claims, 6 Drawing Sheets

CONNECTOR, BOARD ASSEMBLY

BACKGROUND OF THE INVENTION

Technical Field

The present invention relates to a connector, and a board assembly includes a connector mounted to a printed circuit board by means of surface mounting.

Background Art

A connector is known which includes a box-shaped housing opened in one direction, and one or more terminals held in the housing. This housing is obtained by means of injection molding in which a molten resin is injected into a cavity of a mold. Such a housing may be subject to deformation, such as warp and/or sink marks, e.g. due to contraction difference during injection molding or due to a high-temperature atmosphere during soldering the terminal. As a technology for suppressing such deformation of the housing, Patent Document 1 describes that a flange is formed around an opening of a box-shaped housing, and that a hot resin stop is formed at the flange for suppressing runaway of a molten resin.

CITATION LIST

Patent Literature

Patent Document 1: JP 2009-51028 A

SUMMARY OF THE INVENTION

The technology as disclosed in Patent Document 1 has the problem that forming the flange and/or hot resin stop results in increase of the housing size.

An objective of the present invention is to provide a connector with a box-shaped housing which enables increase of the housing in size to be suppressed while suppressing deformation of the housing.

A connector according to the present invention includes: a plurality of terminals; and a housing holding the plurality of terminals, wherein the housing is made of an insulating synthetic resin including reinforcing fibers, wherein the housing has a box shape with a bottom wall, an upper wall, a pair of lateral walls, a rear wall, and an opening in a front side of the housing, wherein a thinned recess is provided in an outer surface of at least one of the bottom wall, the upper wall, and the pair of lateral walls, wherein the thinned recess extends along a front-rear direction of the housing so that a rear end of the thinned recess reaches the rear wall and a front end of the thinned recess does not reach the front side, and wherein the front end is tapered.

A board assembly according to the present invention includes the connector and a printed circuit board, wherein the connector is mounted on the printed circuit board by means of surface mounting.

The present invention enables increase of a housing in size to be suppressed while suppressing deformation of the housing.

DETAILED DESCRIPTION OF PREFERRED EMBODIMENTS

Hereinafter, an embodiment of a "connector" and a "board assembly" according to the present invention will be described with reference to FIGS. 1 to 4.

Figure 1:
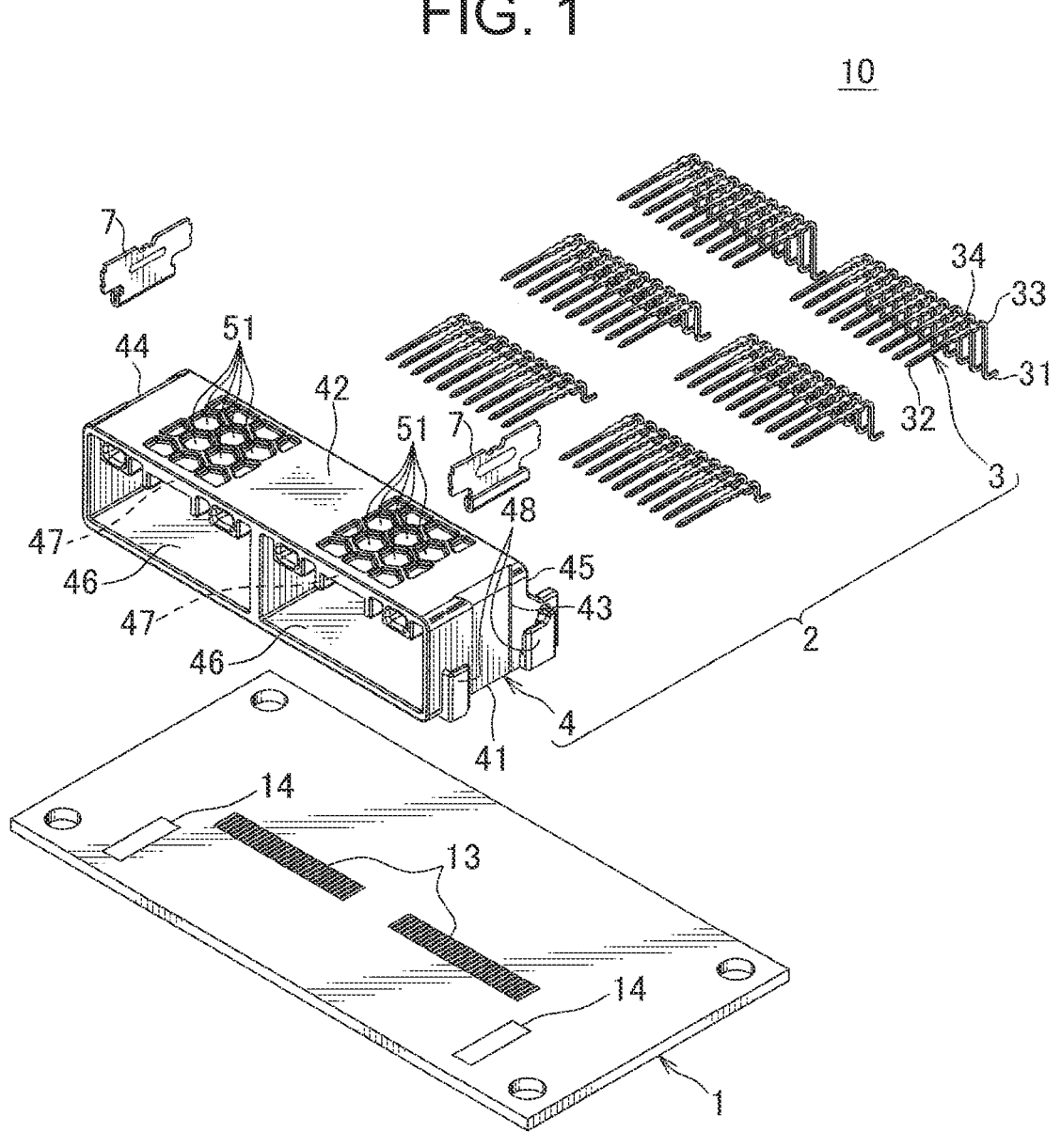
FIG. 1 shows an exploded view of a board assembly including a connector according to an embodiment of the present invention.
Figure 2:
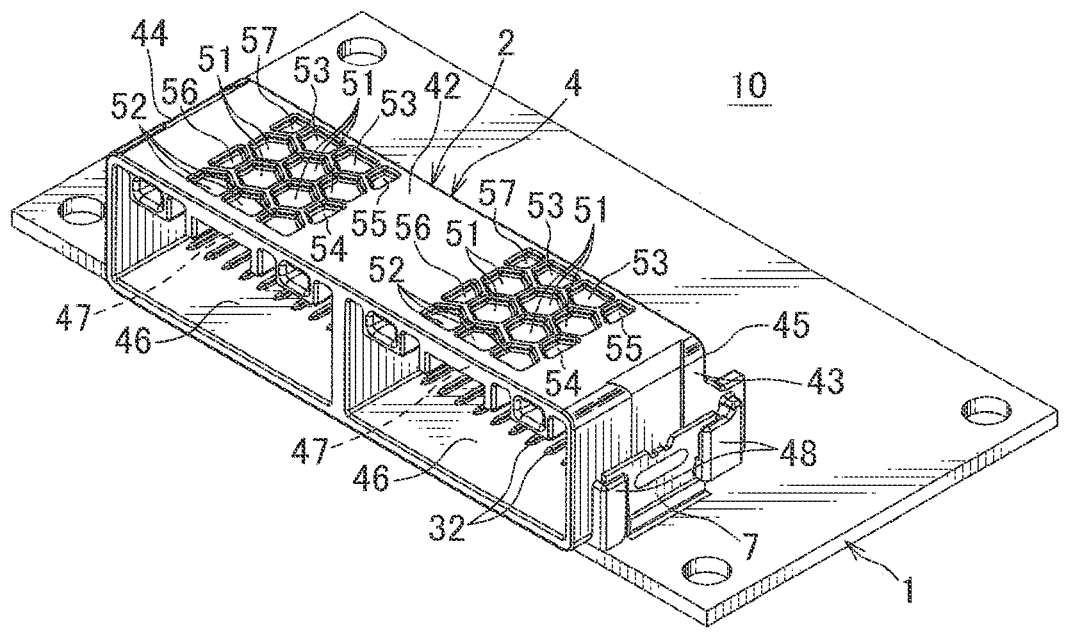
FIG. 2 shows a perspective view of the board assembly according to FIG. 1.

A board assembly 10 as shown in FIGS. 1 and 2 includes a printed circuit board 1, a connector 2 mounted to the printed circuit board 1 by means of surface mounting, and a pair of pegs 7.

The printed circuit board 1 includes one or more circuit patterns formed thereon which are not shown. The printed circuit board 1 further includes pads 13 and peg pads 14, wherein terminals 3 of the connector 2 are soldered to the pads 13, and the pegs 7 are soldered to the peg pads 14. For soldering the terminals 3 and the pegs 7, a solder is printed onto the pads 13 and peg pads 14, and the printed circuit board 1 is then passed through a reflow furnace with the terminals 3 and pegs 7 being placed on the pads 13 and peg pads 14 so that the terminals 3 and pegs 7 are soldered to the pads 13 and 14.

The pair of pegs 7 is made of a metal, wherein the pair of pegs 7 is soldered to the peg pads 14 while being held in a housing 4 of the connector 2 by press-fitting. The pegs 7 are provided for mechanically fixing the housing 4 to the printed circuit board 1, and not electrically connected to the circuit (s) of the printed circuit board 1.

The connector 2 includes a plurality of terminals 3 and the housing 4 holding the plurality of terminals 3.

Each of the terminals 3 is a male terminal which is obtained e.g. by pressing a metal sheet. Each of the terminals 3 includes a board connecting portion 31, a male tab 32, a bent portion 33, and a held portion 34. The board connecting portion 31 is one end of the terminal 3 and soldered to the pad 13. The male tab 32 is the other end of the terminal 3, and positioned inside the housing 4 and mated with a female terminal of a partner connector. The bent portion 33 is a middle portion of the terminal 3 and bent at a right angle. The held portion 34 is a portion between the male tab 32 and the bent portion 33 of the terminal 3 and held by the housing 4.

The housing 4 is obtained by injection molding using a mold, wherein the housing 4 is made of an insulating synthetic resin including reinforcing fibers. Although the synthetic resin of the housing 4 in the present example includes glass fibers as the reinforcing fibers, it may include different fibers such as carbon fibers. The housing 4 is formed in a box shape with a bottom wall 41, an upper wall 42, a pair of lateral walls 43 and 44, a rear wall 45, and openings 46 in a front side of the housing 4.

The bottom wall 41 is overlapped with the printed circuit board 1. The upper wall 42 is opposite to the bottom wall 41 in a thickness direction of the printed circuit board 1. The pair of lateral walls 43 and 44 connects the bottom wall 41 to the upper wall 42. A peg holding portion 48 is provided on each of the lateral walls 43 and 44, wherein one of the pegs 7 is press-fitted into each of the peg holding portion 48. The rear wall 45 connects the bottom wall 41 to the upper wall 42 as well as connects the pair of lateral walls 43 and 44 to each other. Terminal press-fitting portions 49 are formed in the rear wall 45 so as to extend through the rear wall 45, wherein the held portions 34 of the terminals 3 are press-fitted into the terminal press-fitting portions 49. The same number of terminal press-fitting portions 49 is formed as the number of the terminals 3.

The openings 46 are configured for inserting partner connector therein, which is not shown. The partner connector includes a housing and a plurality of female terminals, the housing being configured to be inserted into the housing 4 through the openings 46 to be mated with the housing 4, wherein the female terminals are intended to be mated with the terminals 3. Locking protrusion 47 are formed on an inner surface of the upper wall 42 at a front end of the upper wall 42, wherein the locking protrusions 47 are configured to be locked to the partner connector to maintain a mated state of the connectors each other.

In the present description, the term "front" shall refer to a side of the connector 2 which is closer to the partner connector in a mating direction, while the term "rear" shall refer to a side of the connector 2 facing away from the partner connector in the mating direction, wherein in the mating direction, the connector 2 is configured to be mated with the partner connector. Furthermore, in the present description, a side of the connector 2 overlapped with the printed circuit board 1 shall be defined as a "lower" side, while a side of the connector 2 facing away from the printed circuit board 1 shall be defined as an "upper" side.

A front-rear direction of the housing 4 corresponds to a transverse direction of the housing 4. A facing direction of the pair of lateral walls 43 and 44 in which they face each other corresponds to a longitudinal direction of the housing 4. Furthermore, the bottom wall 41 and upper wall 42 have a rectangular shape with a transverse direction and a longitudinal direction, wherein the transverse direction and the longitudinal direction extend along the front-rear direction of the housing 4 and the facing direction of the pair of lateral walls 43 and 44, respectively. Two openings 46 are formed in the longitudinal direction of the housing 4. Similarly, two locking protrusions 47 as described above are formed in the longitudinal direction of the housing 4. Each of the locking protrusion 47 is formed in the middle of corresponding one of the openings 46.

Figure 3A:
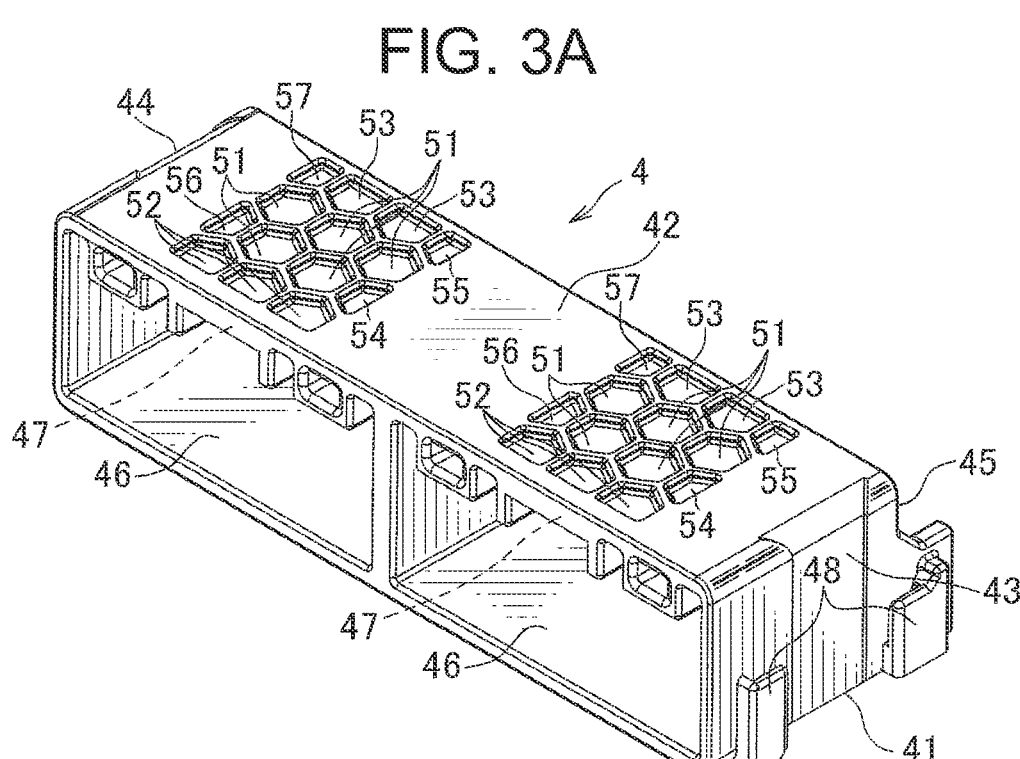
FIG. 3A shows a perspective view of a housing according to FIG. 1 illustrating a front side and an upper wall of the housing.
Figure 3B:
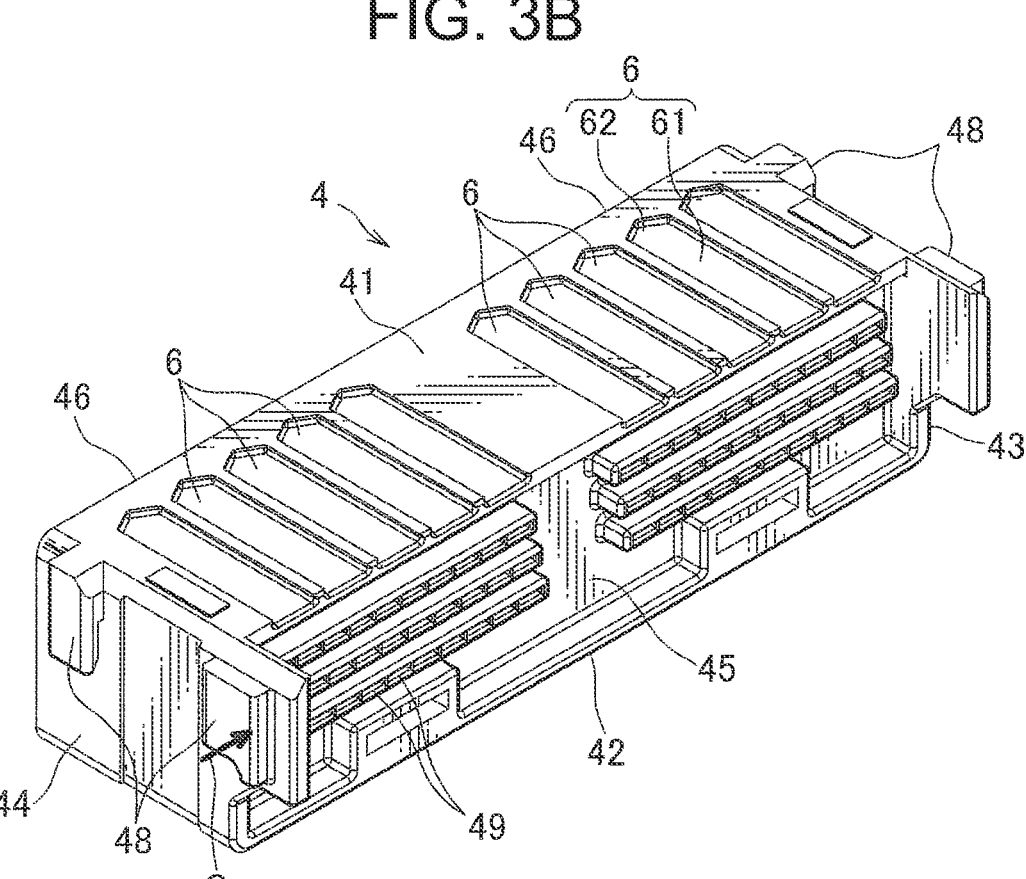
FIG. 3B shows a perspective view of the housing according to FIG. 1 illustrating a bottom wall and a rear wall of the housing.
Figure 4:
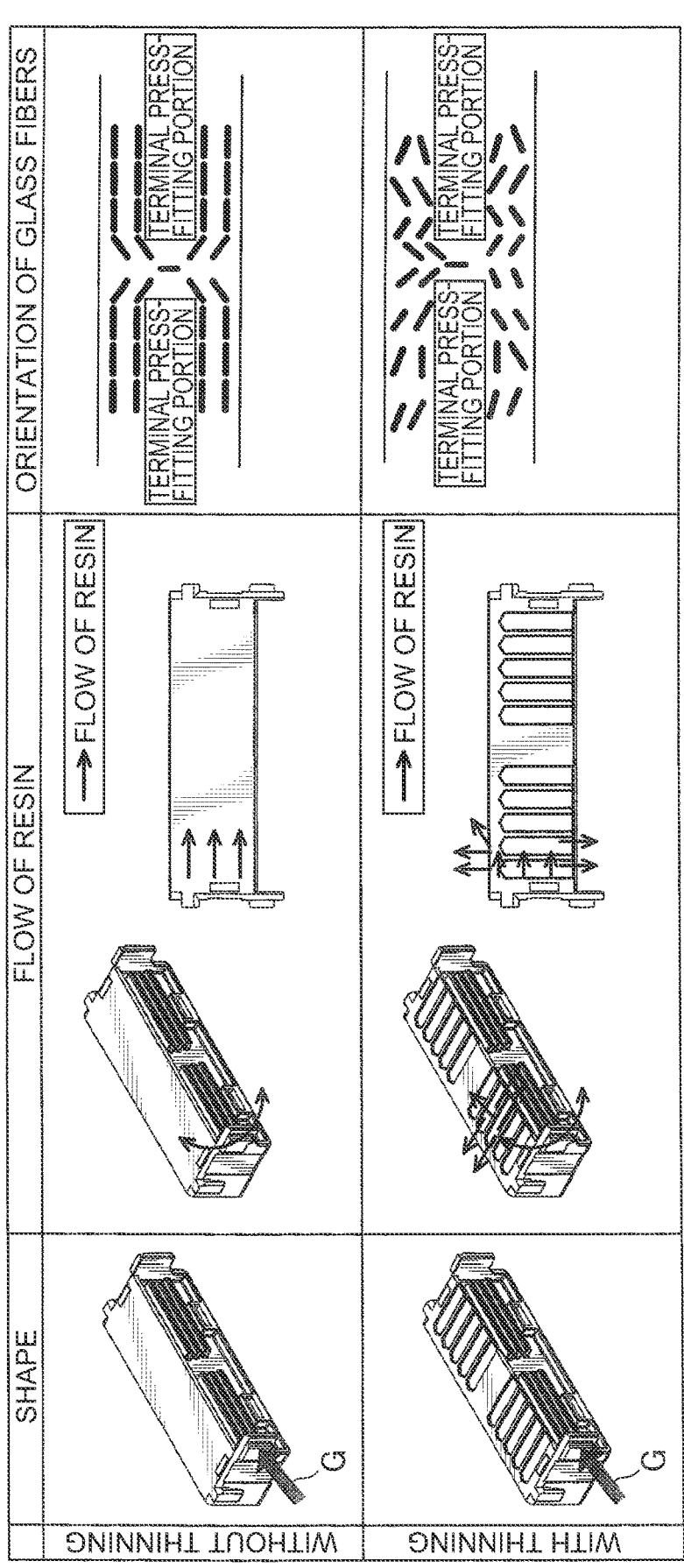
FIG. 4 shows explanatory views illustrating differences between a housing without a thinned recess and the housing with thinned recesses formed therein according to the present invention.

In FIG. 3, an arrow G indicates a gate (inlet for injection of the resin into a mold cavity) position during injection molding of the housing 4. As shown in FIG. 3, the gate position in the housing 4 is located in an outer surface of the lateral wall 44. A gate trace is formed in the outer surface of the lateral wall 44. After being injected into the mold cavity through the gate, a molten resin flows into a portion for defining the lateral wall 44 in the cavity as shown in FIG. 4, then flows therefrom into portions for defining the upper wall 42 and for defining the bottom wall 41. The molten resin then flows toward the lateral wall 43 while being spread along the front-rear direction, and turns around into a portion for defining the rear wall 45.

For injection molding, adjustment of a direction of flow and adjustment of flowing speed of a molten resin through a mold cavity are important in order to obtain a housing 4 with a high dimensional precision. In the present example, a plurality of first thinned recesses 6 (corresponds to a "thinned recess") is formed in an outer surface of the bottom wall 41, and a plurality of second thinned recesses 51-57 is formed in an outer surface of the upper wall 42 in order to adjust the above-mentioned direction and speed of the molten resin flow.

Each of the first thinned recesses 6 is formed by a constant width portion 61 and a front end 62 having a tapered shape, wherein the constant width portion 61 extends along the front-rear direction (transverse direction) of the housing 4. Namely, each of the first thinned recesses 6 is formed in a combined shape of the constant width portion 61 and the front end 62 in which the triangular front end 62 is combined with a front end of the rectangular constant width portion 61. A rear end of the constant width portion 61 reaches the rear wall 45. The front end 62 does not reach the front side of the housing 4. In this manner, each of the thinned recesses 6 extends in a direction (transverse direction of the housing 4) orthogonal to the direction of flow of the molten resin (longitudinal direction of the housing 4) which flows through the portion of the mold cavity for defining the bottom wall 41. Furthermore, the plurality of thinned recesses 6 is arranged in parallel in the bottom wall 41.

The plurality of second thinned recesses 51-57 is formed by honeycomb-shaped recesses (regular hexagonal shape) 51 and partial-honeycomb-shaped recesses 52-57, wherein these recesses 51-57 are arranged regularly at a constant interval. The plurality of second thinned recesses 51-57 is formed so as to avoid the front end of the upper wall 42.

A purpose of forming the first thinned recesses 6 and the second thinned recesses 51-57 so as to avoid the front end of the housing 4 is that a sufficient wall thickness of at the front end of the housing 4, namely around the openings 46, is ensured to guarantee a strength thereof. Furthermore, with the tapered shape of the front ends 62 of the first thinned recesses 6, they change the direction of flow of the molten resin to an oblique direction from the front-rear direction of the housing 4.

With the first thinned recesses 6 and the second thinned recesses 51-57, it is possible to equalize timing of flow in upper and lower sections of the mold cavity so that a housing 4 with a high dimensional precision can be obtained. Furthermore, the molten resin flows in varying direction, which results in complex orientation of glass fibers as shown in FIG. 4 to obtain a constant strength over the entire housing 4 and to suppress warp and/or deformation of the housing 4 when heat is applied to the housing 4. In this manner, a housing 4 can be obtained which suppresses increase in size with a high dimensional precision.

In addition, the board assembly 10 with the connector 2 mounted on the printed circuit board 1 is assembled such that the front ends 62 of the first thinned recesses 6 are positioned more outwardly than an end of the printed circuit board 1. With such arrangement, wind passes along the first thinned recesses 6 during a reflow process so that heat is supplied to the pads 13 on the printed circuit board 1. In this manner, heat retention can be prevented so that failures in solder mounting can be suppressed.

Moreover, the above-described first thinned recesses 6 enable a mold for production of the housing 4 to be miniaturized and/or simplified. This means that the first thinned recesses 6 are formed in a shape extending along a direction for opening/closing the mold, and therefore, the first thinned recesses 6 can be shaped without a slide core.

It is to be noted that a slide core is indeed necessary in order to form the second thinned recesses 51-57, and these second thinned recesses 51-57 have a better dimensional stability than the first thinned recesses 6. Therefore, the housing 4 in the present example is configured such that the second thinned recesses 51-57 are formed in vicinity of the locking protrusions 47 which require a high dimensional precision.

Figure 5:
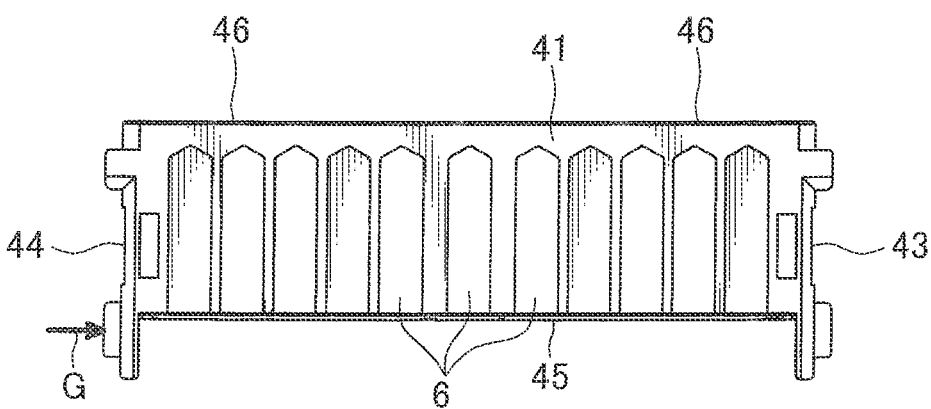
FIG. 5 shows a bottom view of a first variant of the housing according to FIGS. 3A and 3B.

Next, variants of the above-described housing 4 will be described with reference to FIGS. 5 to 8. While the first thinned recesses 6 according to the above embodiment are formed so as to avoid the middle of the bottom wall 41 in the longitudinal direction, first thinned recesses 6 according to a first variant as shown in FIG. 5 are formed across the bottom wall 41 in the longitudinal direction (except for a front end of the bottom wall 41).

Figure 6:
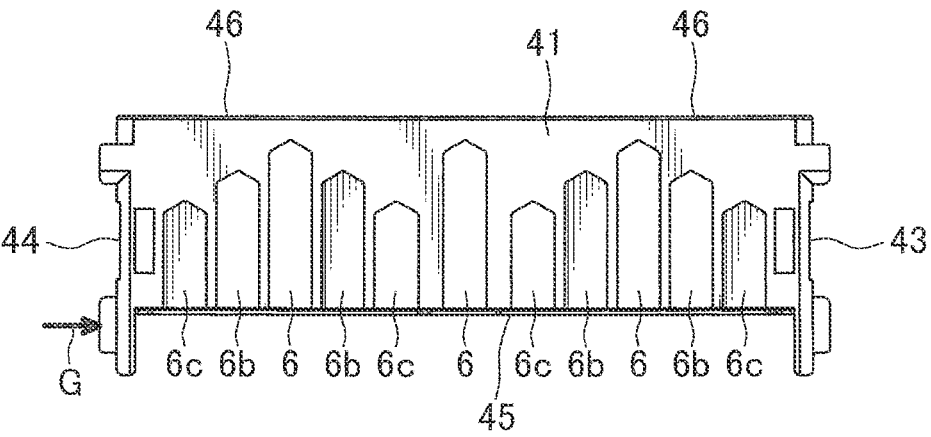
FIG. 6 shows a bottom view of a second variant of the housing according to FIGS. 3A and 3B.
Figure 7:
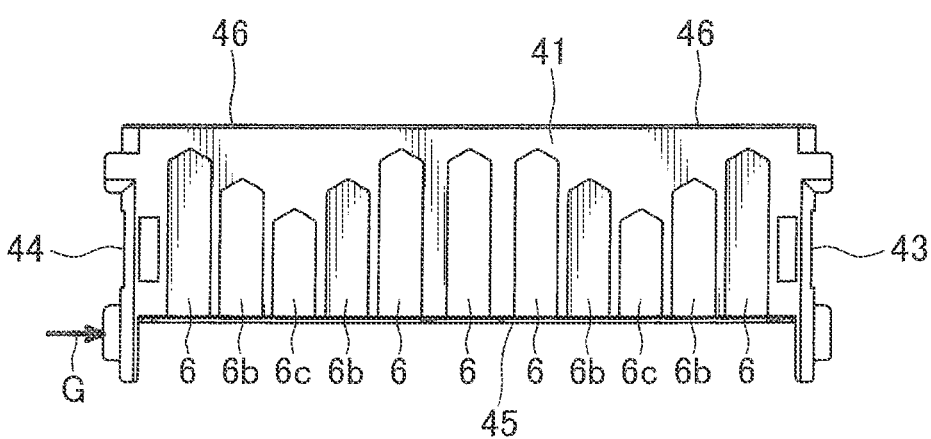
FIG. 7 shows a bottom view of a third variant of the housing according to FIGS. 3A and 3B.
Figure 8:
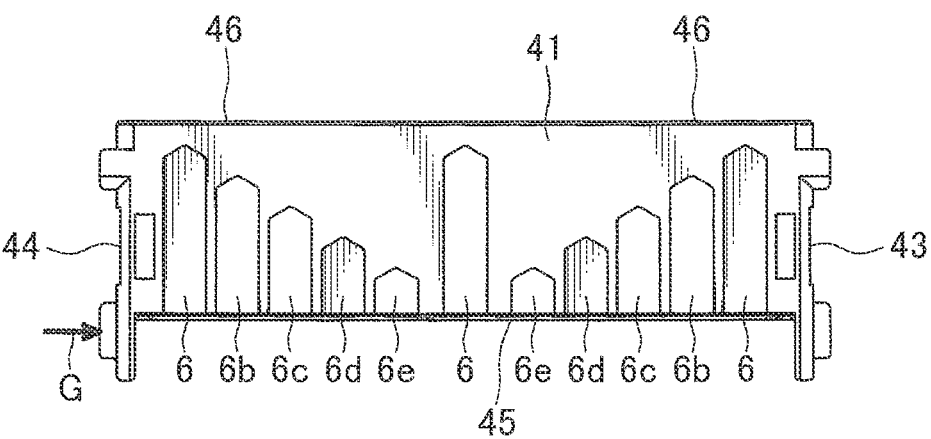
FIG. 8 shows a bottom view of a fourth variant of the housing according to FIGS. 3A and 3B.

According to second through fourth variants as shown in FIGS. 6 to 8, first thinned recesses 6, 6b-6e with different lengths are combined. Each of housing according to the second through fourth variants can be formed by using a specific mold without a slide core, although these housing can be also formed by using a common mold with a slide core(s). In the latter case, the housing can be formed by offsetting a position(s) of the slide core(s) relative to a main mold in a direction for opening/closing the main core. By adjusting a length and/or layout of the first thinned recesses 6, 6b-6e as shown in the second through fourth variants, it is possible to adjust the direction of flow and the speed of flow of the molten resin through a mold cavity.

Although in the above embodiment and variants, the first thinned recesses 6 have been described as being formed only in the bottom wall 41, the present invention is not limited thereto, and the thinned recesses 6 may be formed in the outer surface of at least one of the bottom wall 41, the upper wall 42 and the pair of lateral walls 43 and 44.

It is to be noted that the embodiments as described above merely illustrate representative examples for the present invention, and the present invention is not limited to these embodiments. I.e., various modifications may be performed without departing from the core of the present invention. It is obvious that such modifications are included in the scope of the present invention as far as the modifications comprise the features of the present invention.

REFERENCE SIGNS LIST

1 Printed circuit board
2 Connector
3 Terminals
4 Housing
6, 6b-6e First thinned recesses (Thinned recesses)
10 Board assembly
41 Bottom wall

42 Upper wall
43, 44 Lateral walls
45 Rear wall
46 Opening
51-57 Second thinned recesses

What is claimed is:

1. A connector comprising:
a plurality of terminals; and
a housing holding the plurality of terminals,
wherein the housing is made of an insulating synthetic resin including reinforcing fibers,
wherein the housing has a box shape with a bottom wall, an upper wall, a pair of lateral walls, a rear wall, and an opening in a front side of the housing,
wherein a thinned recess is provided in an outer surface of at least one of the bottom wall, the upper wall, or the pair of lateral walls,
wherein the thinned recess extends along a front-rear direction of the housing so that a rear end of the thinned recess reaches the rear wall and a front end of the thinned recess does not reach the front side, and
wherein the front end is tapered.

2. The connector according to claim 1,
wherein a plurality of thinned recesses is provided in an outer surface of the bottom wall, the plurality of thinned recesses being arranged in parallel.

3. The connector according to claim 1,
wherein a locking protrusion configured to be locked to a partner connector is provided in an inner surface of the upper wall,
wherein no thinned recess is provided in an outer surface of the upper wall,
wherein a plurality of second thinned recesses is provided in the outer surface of the upper wall, and
wherein the plurality of second thinned recesses is formed by a honeycomb-shaped recess and partial-honeycomb-shaped recess.

4. The connector according to claim 1,
wherein the upper wall has a rectangular shape with a transverse direction and a longitudinal direction,
wherein the transverse direction extends along the front-rear direction of the housing, and the longitudinal direction extends along a facing direction of the pair of lateral walls in which the pair of lateral walls face each other, and
wherein a gate position for molding is located in an outer surface of one of the pair of lateral walls.

5. A board assembly comprising:
the connector according to claim 1; and
a printed circuit board,
wherein the connector is mounted on the printed circuit board by means of surface mounting.

6. The board assembly according to claim 5,
wherein the front end of the thinned recess is positioned more outwardly than an end of the printed circuit board.

\* \* \* \* \*